(12) United States Patent
Wang et al.

(10) Patent No.: US 10,765,042 B1
(45) Date of Patent: Sep. 1, 2020

(54) INTEGRATED POWER MODULE AND CAPACITOR MODULE THERMAL AND PACKAGING DESIGN

(71) Applicant: FORD GLOBAL TECHNOLOGIES, LLC, Dearborn, MI (US)

(72) Inventors: Fan Wang, Novi, MI (US); Lihua Chen, Farmington Hills, MI (US); Joseph Sherman Kimmel, Carleton, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 16/283,626

(22) Filed: Feb. 22, 2019

(51) Int. Cl.
| | |
|---|---|
| *H02B 1/48* | (2006.01) |
| *H05K 7/02* | (2006.01) |
| *H05K 7/20* | (2006.01) |
| *F28D 9/00* | (2006.01) |
| *H02G 5/02* | (2006.01) |
| *H02M 7/00* | (2006.01) |

(52) U.S. Cl.
CPC ........... *H05K 7/209* (2013.01); *F28D 9/0081* (2013.01); *H02B 1/48* (2013.01); *H02G 5/02* (2013.01); *H02M 7/003* (2013.01); *H05K 7/02* (2013.01); *H05K 7/2089* (2013.01)

(58) Field of Classification Search
None
See application file for complete search history.

(56) References Cited

U.S. PATENT DOCUMENTS

| 7,299,639 | B2 * | 11/2007 | Leija | H01L 23/38 257/E23.082 |
|---|---|---|---|---|
| 7,965,510 | B2 * | 6/2011 | Suzuki | B60K 6/365 361/699 |
| 9,854,718 | B2 | 12/2017 | Garriga et al. | |
| 2004/0062006 | A1 * | 4/2004 | Pfeifer | H01L 23/473 361/699 |
| 2005/0126184 | A1 * | 6/2005 | Cauchy | H01L 35/32 62/3.3 |
| 2008/0013253 | A1 * | 1/2008 | Thrap | H01G 9/016 361/502 |

(Continued)

OTHER PUBLICATIONS

Callegro, Alan Dorneles et al., Bus Bar Design for High-Power Inverters, IEEE Transactions on Power Electronics, vol. 33, No. 3, Apr. 6, 2017.

*Primary Examiner* — Courtney L Smith
(74) *Attorney, Agent, or Firm* — David Kelley; Brooks Kushman P.C.

(57) ABSTRACT

An integrated capacitor and power module include a power module, an intermediate cold plate, and a capacitor module. The intermediate cold plate has a first side attached to the power module and a second side opposite the first side. The capacitor module is attached to a second side of the intermediate cold plate. The capacitor module includes a plurality of metalized film capacitor cells supported by a metal plate and a base cold plate with a layer of thermal interface material between the metal plate and the base cold plate. A fluid circulation system is operatively connected to the intermediate cold plate to circulate a fluid through the cold plate. The capacitor module includes a housing, a plurality of capacitor cells and first and second busbars. Alternating cell arrays have a P-end and an N-end that are inverted relative to each other.

15 Claims, 6 Drawing Sheets

(56) References Cited

U.S. PATENT DOCUMENTS

| | | | |
|---|---|---|---|
| 2010/0134983 A1* | 6/2010 | Rechenberg | H01G 11/10 |
| | | | 361/715 |
| 2012/0019970 A1* | 1/2012 | Nagano | H02M 5/293 |
| | | | 361/91.7 |
| 2018/0233285 A1* | 8/2018 | Sato | H01G 4/224 |
| 2019/0080850 A1* | 3/2019 | Inazumi | H01G 2/14 |

* cited by examiner

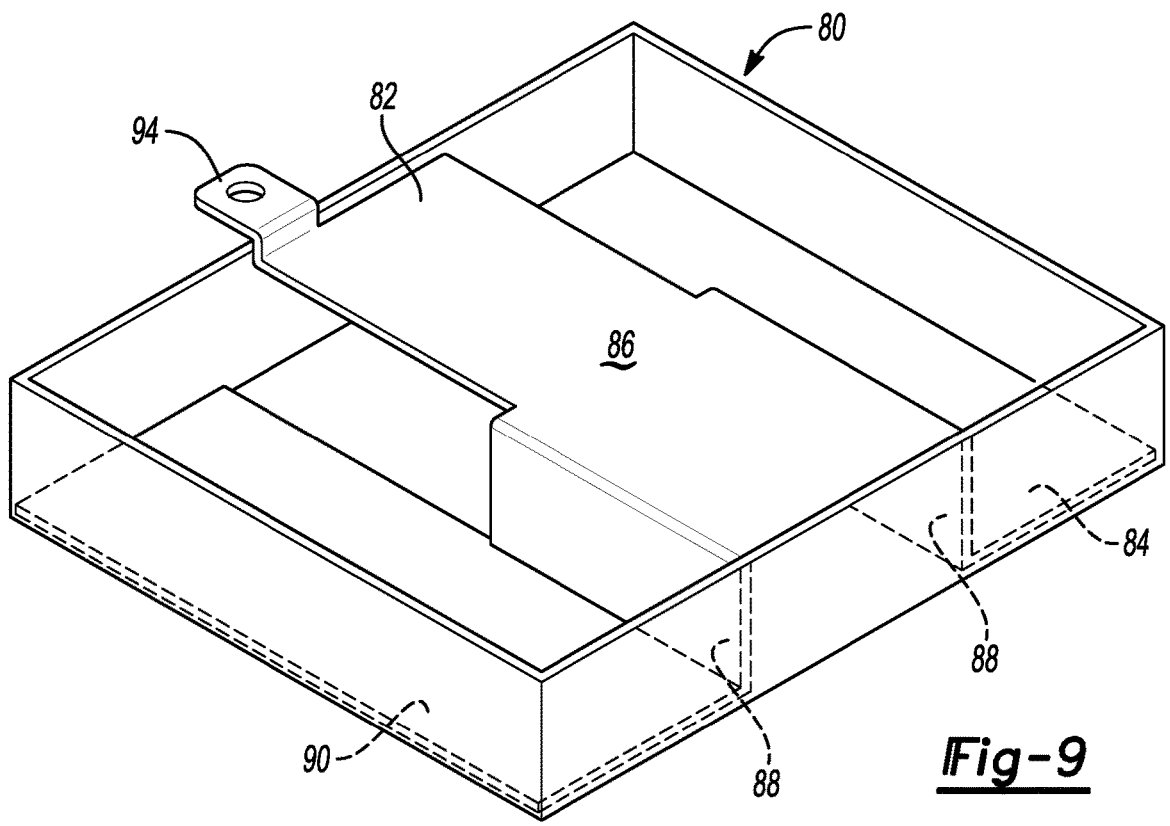
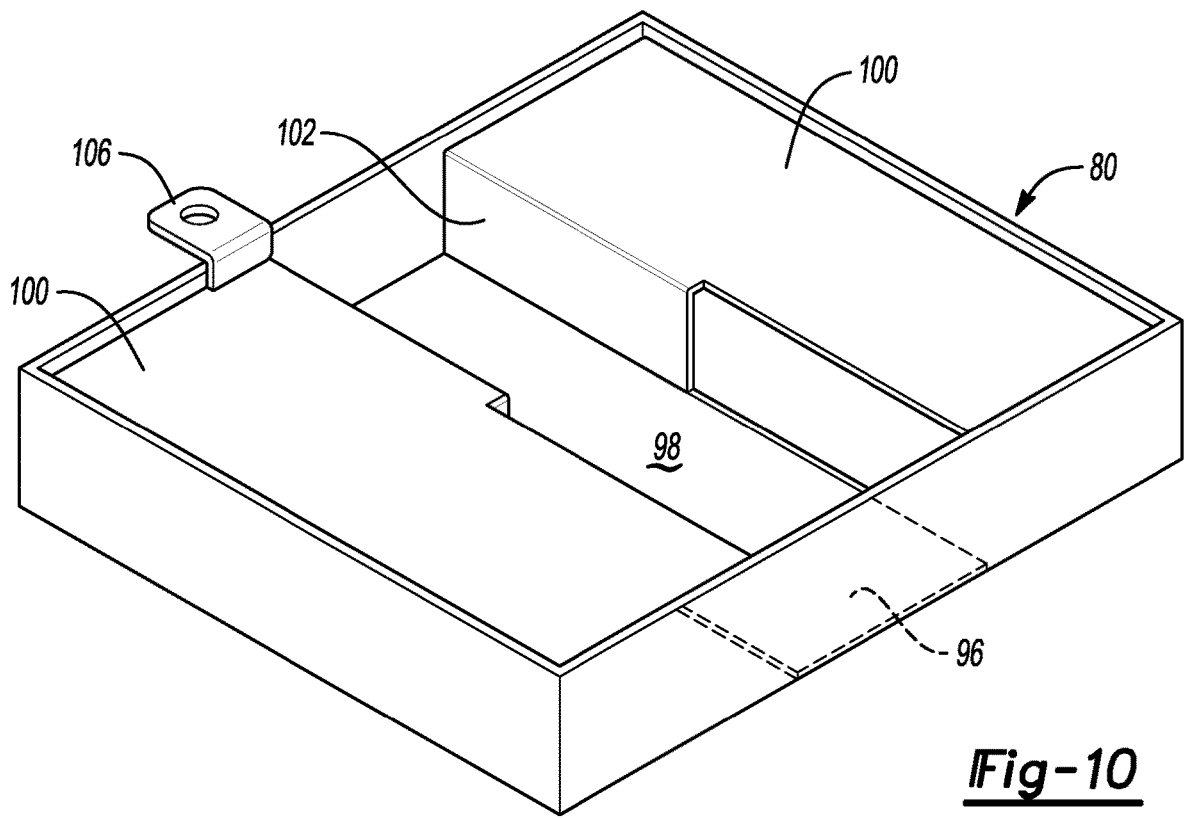

US 10,765,042 B1

INTEGRATED POWER MODULE AND CAPACITOR MODULE THERMAL AND PACKAGING DESIGN

TECHNICAL FIELD

This disclosure relates to integrated capacitor and power modules and capacitor modules having busbars that connect oppositely oriented cells of adjacent arrays of cells and may also provide a thermal path to a cold plate.

BACKGROUND

Electric Vehicles (EVs), Hybrid Electric Vehicles (HEVs), and Plug-in Hybrid Electric Vehicles (PHEVs) are being developed with a goal of improving fuel efficiency and reducing $CO_2$ emissions. These types of electric vehicles may include a traction drive inverter system that includes a power module and a capacitor module. One way to improve fuel efficiency is by downsizing and reducing the weight of the traction drive inverter system. However, continued miniaturization of traction drive inverter systems has resulted in challenges of mechanical integration and cooling design for components, such as the power module and DC-link capacitor.

SUMMARY

According to one aspect of this disclosure, an integrated capacitor and power module is disclosed that includes a power module, an intermediate cold plate, and a capacitor module. The intermediate cold plate has a first side attached to the power module and a second side opposite the first side. The capacitor module is attached to a second side of the intermediate cold plate. The capacitor module includes a plurality of metalized film capacitor cells supported by a metal plate and a base cold plate with a layer of thermal interface material between the metal plate and the base cold plate. A fluid circulation system is operatively connected to the intermediate cold plate to circulate a fluid through the cold plate.

According to another aspect of this disclosure, a capacitor module is disclosed that includes a housing, a plurality of capacitor cells and first and second busbars. The capacitor cells are aligned in a first cell array and a second cell array on a base plate of the housing. The first and second cell arrays have a P-end and an N-end on each cell. The P-end and N-end of adjacent first and second cell arrays are inverted relative to each other. The first busbar has a first lower portion directly contacting the P-end of each cell below the first cell array, a first upper portion directly contacting the P-end of each cell above the second cell array, and a first intermediate portion connecting the first lower portion and the first upper portion. The second busbar has a second lower portion directly contacting the N-end of each cell below the second cell array, a second upper portion directly contacting the N-end of each cell above the first cell array, and a second intermediate portion connecting the second lower portion and the second upper portion. The first busbar and the second busbar are electrically isolated from each other.

According to another aspect of this disclosure, a capacitor module is disclosed that includes a housing, a plurality of capacitor cells aligned in several linear arrays, and an N-busbar and a P-busbar. The housing includes a base plate on which the capacitor cells are aligned in several linear arrays. The linear arrays have a P-end of each cell and an N-end of each cell of adjacent linear arrays are oppositely oriented relative to each other. The N-busbar contacts an N-end of the capacitor cells of the several linear arrays. The P-busbar contacts a P-end of the capacitor cells of the several linear arrays. The N-busbar includes N-busbar linking portions connecting the N-ends of adjacent linear arrays, and the P-busbar includes P-busbar linking portions connecting the P-ends of adjacent linear arrays. The N-busbar and the P-busbar are electrically isolated from each other.

The above aspects of this disclosure and other aspects will be described below with reference to the attached drawings.

BRIEF DESCRIPTION OF THE DRAWINGS

FIG. 9 is a diagrammatic perspective view of a P busbar for a capacitor module having three rows of cells disposed in a housing without any capacitor cells.

FIG. 10 is a diagrammatic perspective view of an N busbar for a capacitor module having three rows of cells disposed in a housing without any capacitor cells.

DETAILED DESCRIPTION

Figure 1:
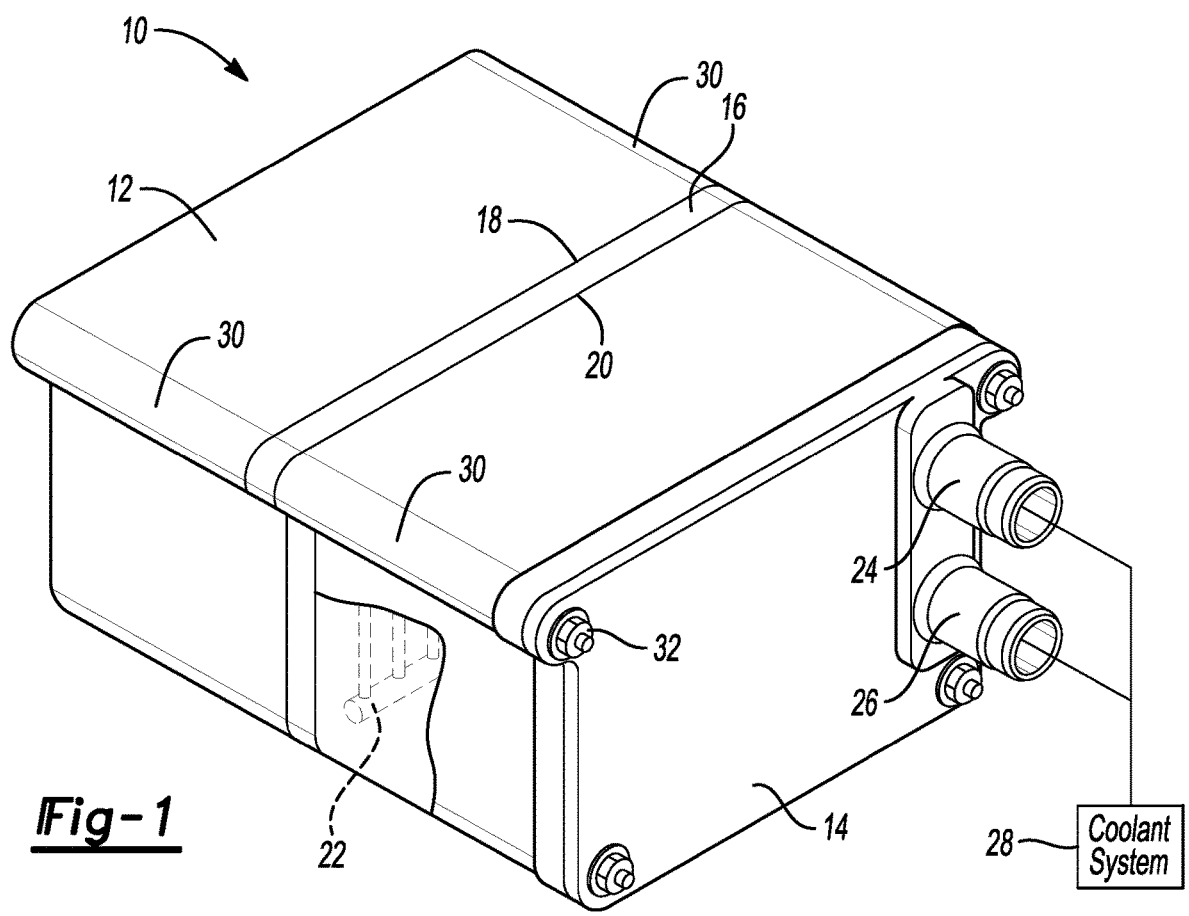
FIG. 1 is a perspective view of an integrated power module and a capacitor module made according to one embodiment of the disclosure.

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

A DC-link capacitor may be connected between a plurality of busbars. The main functions of the DC-link capacitor include absorbing ripple currents generated either by the inverters or by power sources and stabilizing the DC-link voltage for inverter control. Film capacitors with various configuration are widely used for DC-link capacitor applications that are subject to extensive high ripple currents in certain driving conditions.

Capacitor heat loss is generated either by dielectric material self-heating due to ripple current, or by electrode system Ohm loss. Advanced technology has been applied to film capacitor design to improve the capability to pack more capacitance in a smaller volume at a given voltage rating. However, this results in higher heat loss density.

For conventional DC-link capacitor designs, the capacitor module is usually made up of individual film cells (metalized polypropylene), that are encapsulated in an engineering plastic housing with potting resin for electrical insulation, mechanical and humidity protection for film cells. The capacitor module may also contain busbars for connecting ends of film cells to DC terminals (P and N).

The thermal paths for a conventional DC-link capacitor package transfer heat from the center of the cells upwardly through a busbar and potting material to be transferred by convection to ambient. Heat is also transferred from the center of the cells downwardly through a busbar through the potting material and the housing and transferred to the surrounding environment through natural convection.

One challenge is that thermal conductivity is low for capacitor cells, potting and housing materials resulting in high thermal resistance along the thermal paths. To meet the thermal performance requirements, a capacitor having increased size may be selected with greater module skin area that leads to the oversizing and low cooling effectiveness because the thermal path becomes even longer as capacitor size increases.

In addition, DC-link capacitor terminals are connected to the inverter power module. The capacitor module should be placed as close as possible to the power module to minimize the parasitic inductance. The operating temperature of the power module can be as high as 150 degrees C., whereas the maximum allowable temperature of the capacitor module is usually less than 105 degrees C. Considerable heat energy may be transferred from power module to the capacitor terminals resulting in additional heating of the capacitor cells.

FIG. 1 illustrates one embodiment of an integrated power and capacitor module 10 that includes a capacitor module 12, a power module 14, and an intermediate cold plate 16. The cold plate 16 is attached on a first side 18 to the capacitor module portion 12 and on an oppositely oriented second side 20 to the power module 14. The cold plate 16 defines an internal coolant channel 22 that receives coolant fluid from a coolant inlet channel 24 and returns the coolant fluid through a coolant outlet channel 26 to a coolant circulation system 28.

The capacitor module 12, the power module 14, and the intermediate cold plate 16 include a plurality of fastener bosses 30 for receiving fasteners 32.

Figure 2:
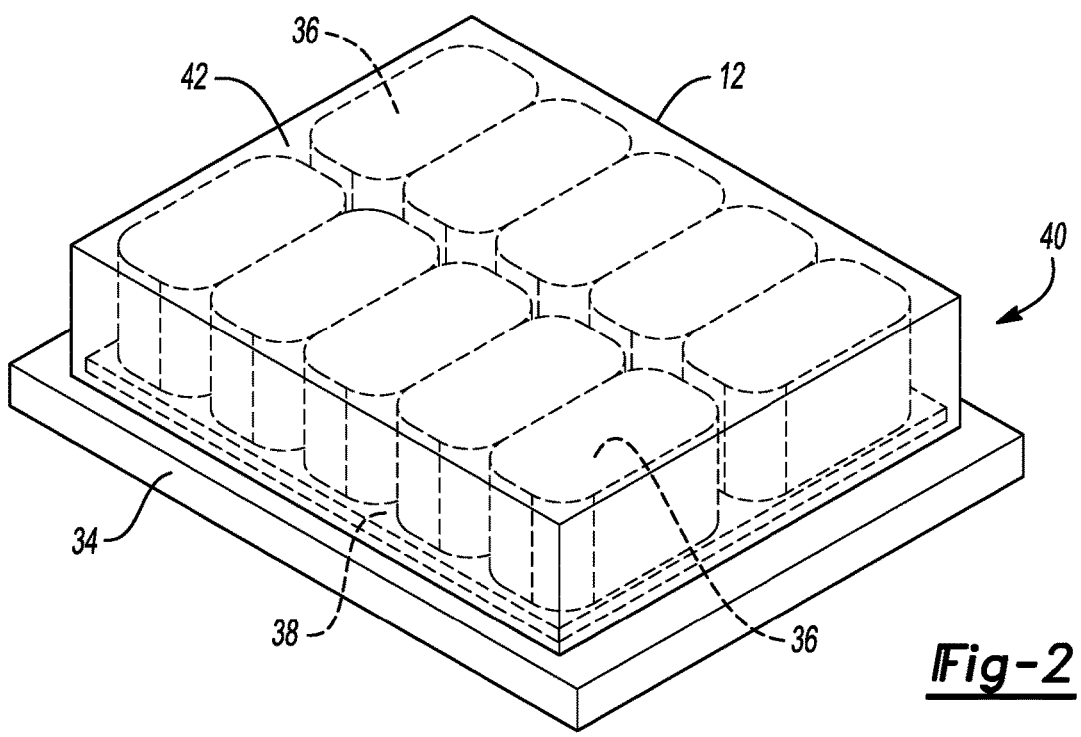
FIG. 2 is a diagrammatic perspective view of the heat sink, base plate and sidewalls of a housing and a plurality of capacitor cells.

FIG. 2 illustrates the capacitor module 12 and a cold plate 34. The cold plate 34 may be a solid plate or may include an internal coolant channel like the intermediate cold plate 16 shown in FIG. 1. The cold plate 34 may be provided in combination with the cold plate 16 or may be provided without the cold plate 16. The capacitor module 12 includes a plurality of metalized film capacitor cells 36 arranged in two linear arrays of capacitor cells 36. The capacitor cells 36 are supported by a copper base plate 38. The copper base plate 38 could alternatively be made of a different metal, if desired. The base plate 38 forms part of a housing 40 in combination with a plurality of plastic sidewalls 42 shown in phantom lines. The housing 40 is supported on the cold plate 34.

Figure 3:
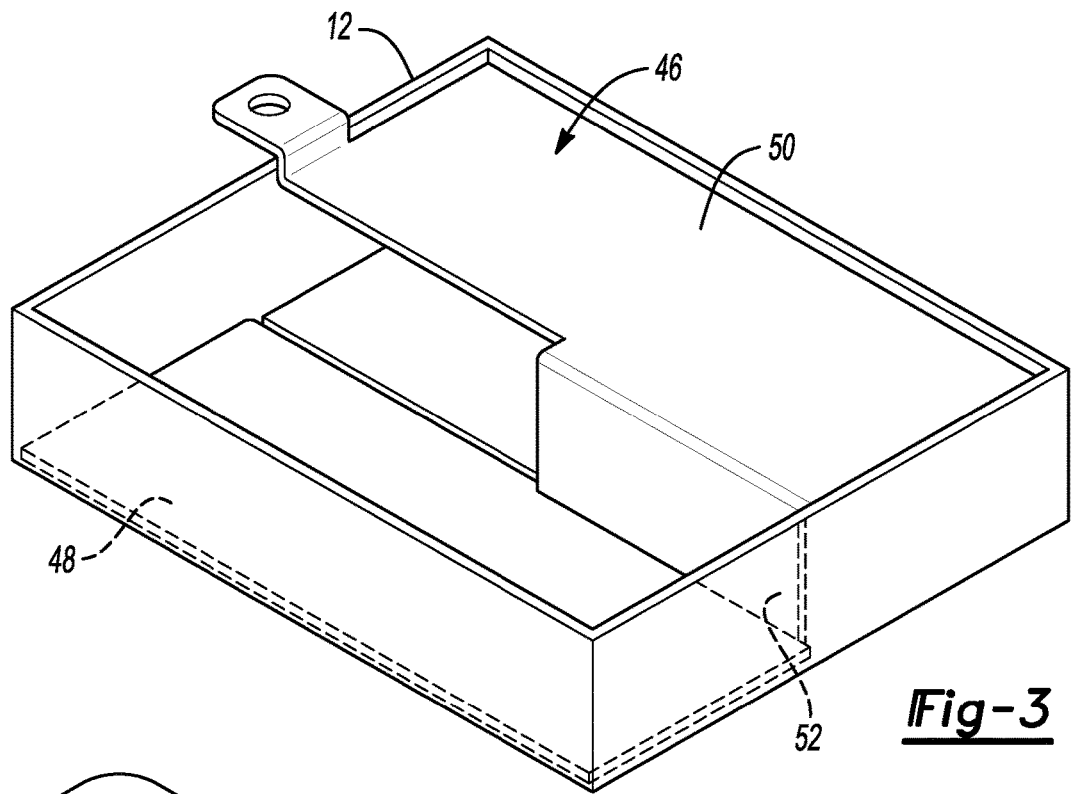
FIG. 3 is a diagrammatic perspective view of a P busbar disposed in a housing without any capacitor cells.
Figure 4:
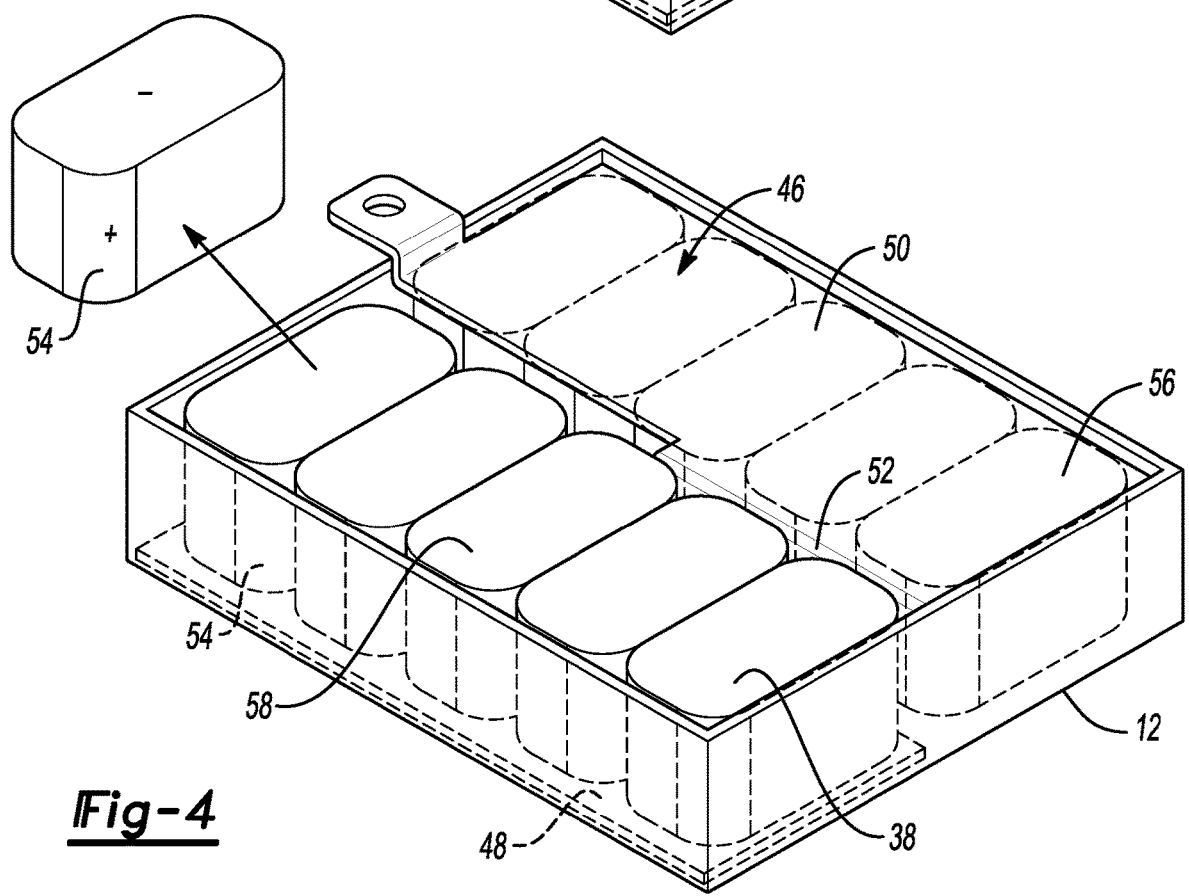
FIG. 4 is a diagrammatic perspective view of the P busbar disposed in the housing with capacitor cells arranged in linear arrays with alternating rows being oppositely oriented.

Referring to FIGS. 3 and 4, the capacitor module 12 is shown to include a P-busbar 46 with the capacitor cells 38 shown in FIG. 4 and omitted from FIG. 3 for better visibility. The P-busbar 46 includes a lower portion 48 and an upper portion 50 that are connected by an intermediate portion 52 (or linking portion). The P-end 54 of each capacitor cell 38 is in contact with the lower portion 48 of the P-busbar 46 or the upper portion 50 of the P-busbar 46. The intermediate portion 52 extends between a first cell array 56 and an adjacent second cell array 58 and electrically connects the lower portion 48 and the upper portion 50. As shown in FIG. 4, a first cell array 56 has a P-end 54 in contact with the upper portion 50 of the P-busbar 46 and a second cell array 58 has a P-end 54 in contact with the lower portion 48 of the P-busbar 46.

Figure 5:
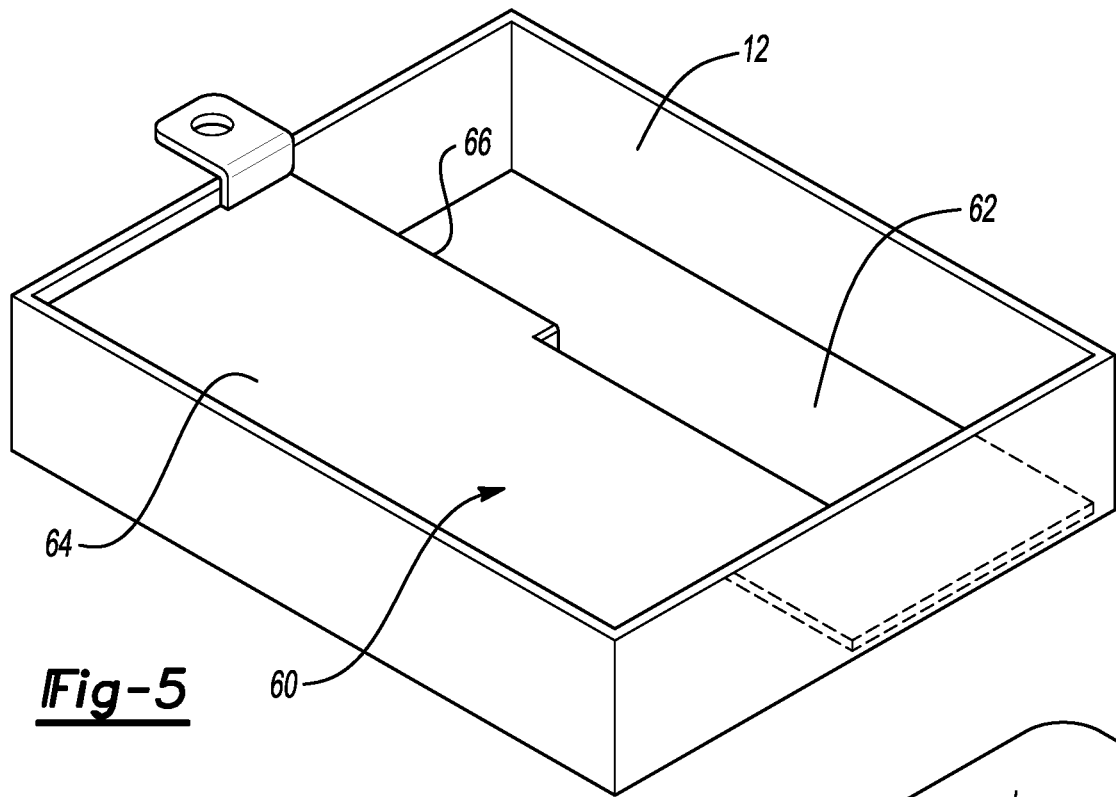
FIG. 5 is a diagrammatic perspective view of an N busbar disposed in a housing without any capacitor cells.
Figure 6:
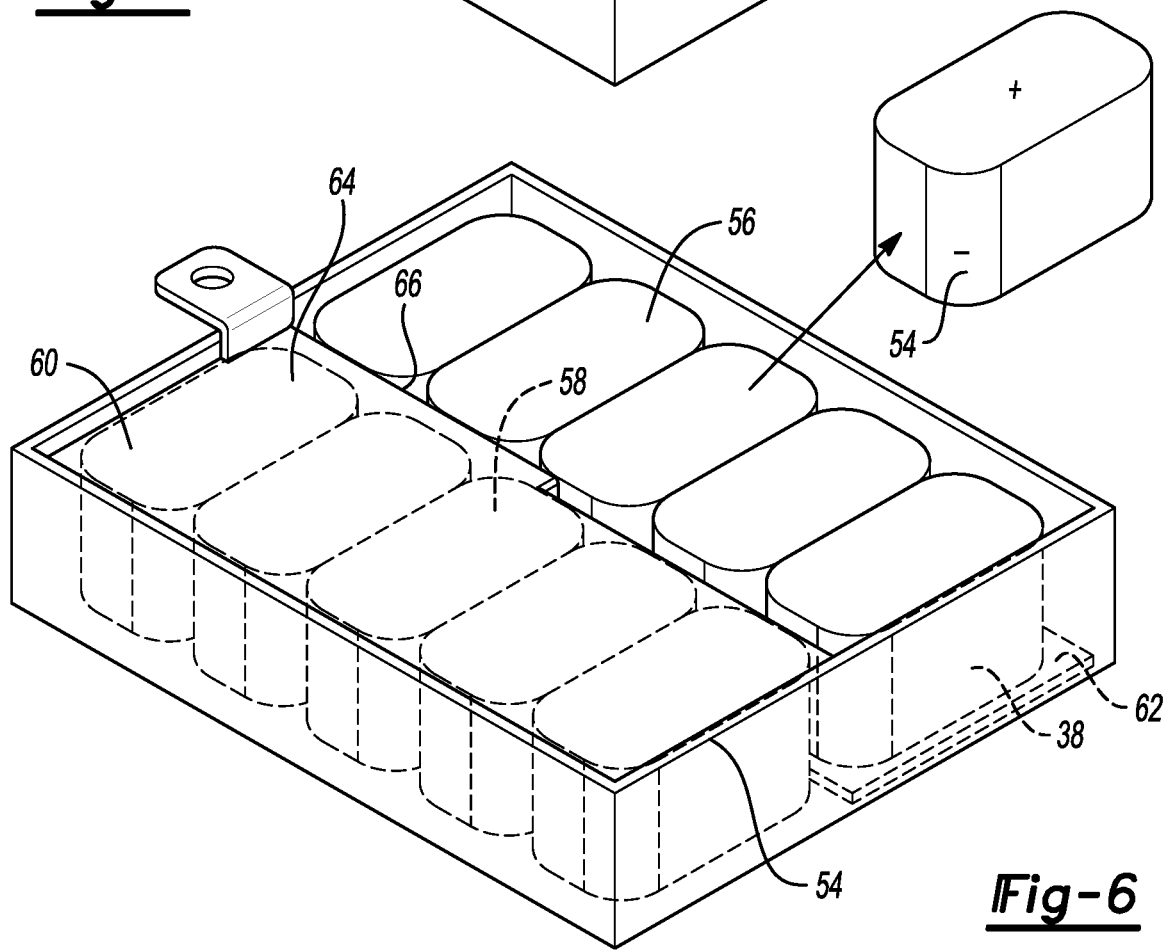
FIG. 6 is a diagrammatic perspective view of the N busbar disposed in the housing with capacitor cells arranged in linear arrays with alternating rows being oppositely oriented.

Referring to FIGS. 5 and 6, the capacitor module 12 is shown to include an N-busbar 60 with the capacitor cells 38 shown in FIG. 6 and omitted from FIG. 5. The N-busbar 60 includes a lower portion 62 and an upper portion 64 that are connected by an intermediate portion 66 (or linking portion). The N-end 68 of each capacitor cell 38 is in contact with the lower portion 62 of the N-busbar 60 or the upper portion 64 of the N-busbar 60. The intermediate portion 66 extends between a first cell array 56 and an adjacent second cell array 58 and electrically connects the lower portion 62 and the upper portion 64. As shown in FIG. 6, a first cell array 56 has the N-end 68 in contact with the upper portion 64 of the N-busbar 60 and a second cell array 58 has an N-end 68 in contact the with the lower portion 62 of the N-busbar 60.

Figure 7:
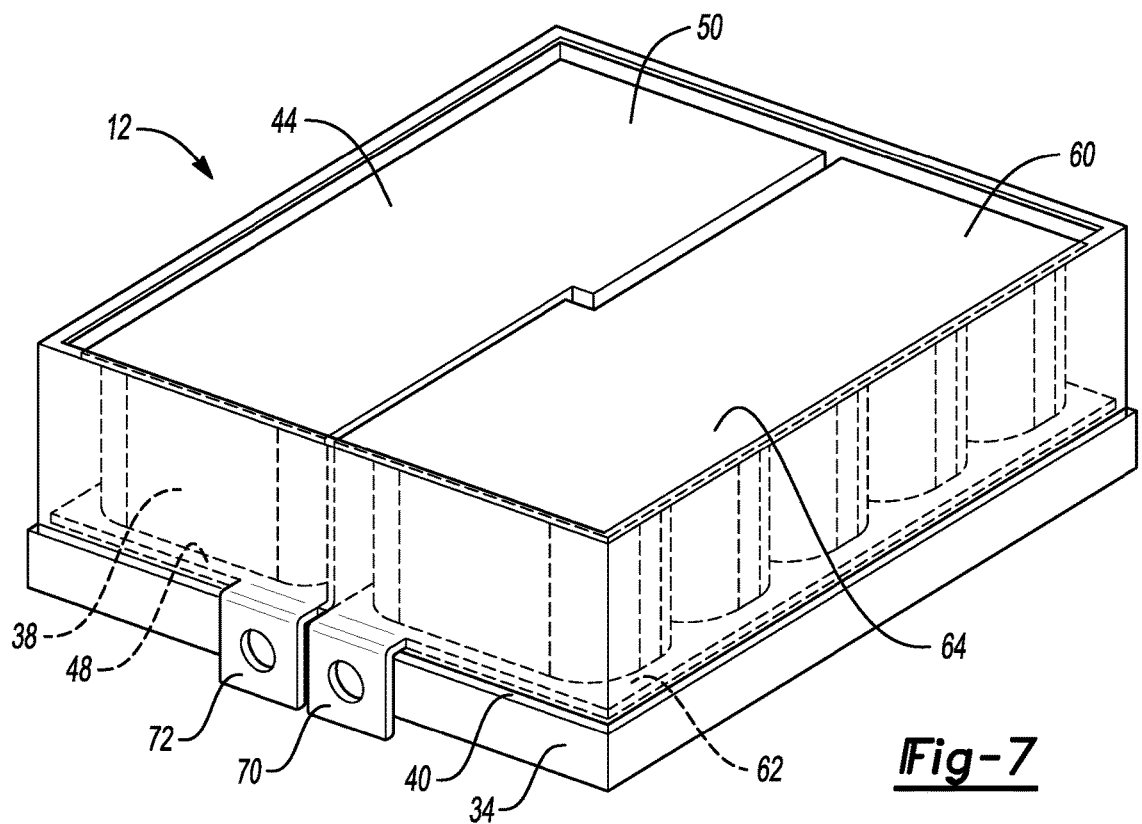
FIG. 7 is a diagrammatic perspective view of a capacitor module fully assembled with the sidewalls shown in phantom lines.
Figure 8:
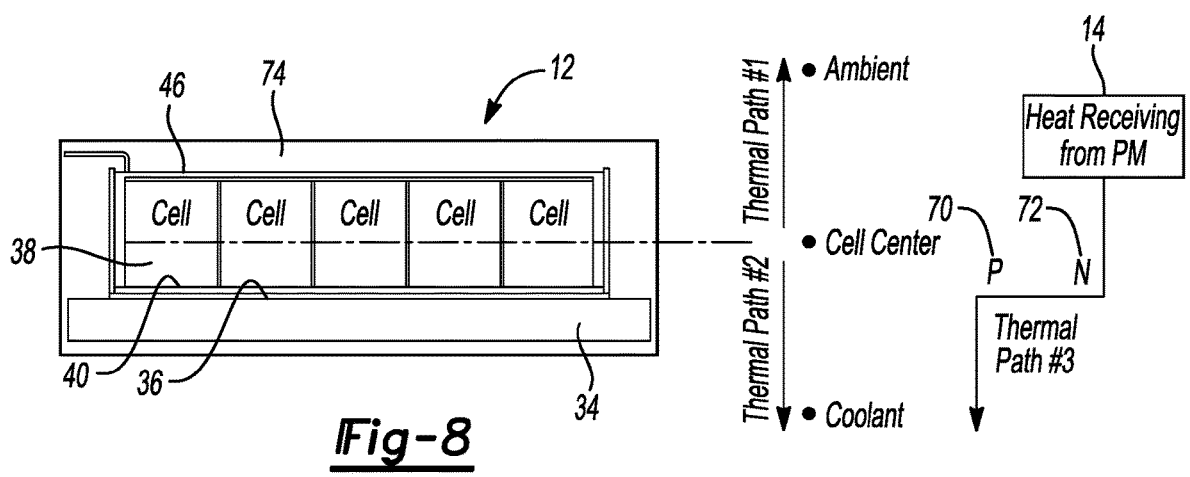
FIG. 8 is a diagrammatic elevation view of the capacitor module with three heat dissipation thermal paths.

Referring to FIG. 7, the capacitor module 12 is shown with the P-busbar 46 and the N-busbar 60 assembled to the base plate 40 with the capacitor cells 38 between the respective upper portions 50 and 64 and lower portions 48 and 62 of the busbars 46 and 60. A P-terminal 70 and an N-terminal 72 are connected to the P-busbar 46 and the N-busbar 60 and are provided to connect the capacitor module to the power module 14. As shown in FIG. 8, the terminals 70, 72 are disposed on the bottom of the capacitor cells 38 close to the lower cold plate 34 and the power module 14 (shown in FIG. 1). Heat from the power module 14 and the capacitor module 12 is transferred from the terminals 70, 72 to the lower cold plate 34.

Referring to FIG. 8, three thermal paths for cooling the capacitor cells 38 are shown diagrammatically. In the first thermal path, heat is conducted upwardly from the capacitor cells 38, through one of the busbars 46 or 60, through a potting material 74 and to ambient air above the capacitor module 12. In the second thermal path, heat is conducted downwardly from the capacitor cells 38, in sequence through the base plate 40, the thermal interface material 36, the lower cold plate 34 to ambient. In the third thermal path heat received from the power module 14 through the terminals 70 and 72, and sequentially through the P-busbar 46 and N-busbar 60.

Referring to FIG. 9, an alternative embodiment of a capacitor module 80 includes 3 linear arrays of capacitor cells 38. The same reference numerals used with reference to the embodiment of FIGS. 1-8 are used to identify similar parts of the embodiment of FIGS. 9-11. The capacitor module 80 includes a P-busbar 82. The P-busbar 82 includes two lower portions 84 and an upper portion 86 that are connected by an intermediate portion 88. The P-end 90 of each capacitor cell 38 is in contact with the lower portion 84 of the P-busbar 82 or the upper portion 86 of the P-busbar 82. A P-terminal 94 is provided on the upper portion 86 of the busbar 82.

Referring to FIG. 10, the alternative embodiment of a capacitor module 80 includes an N-busbar 96. The N-busbar 96 includes a lower portion 98 and two upper portions 100 that are connected by an intermediate portion 102. The N-end 104 of each capacitor cell 38 is in contact with the lower portion 98 of the N-busbar 96 or the upper portion 100 of the N-busbar 96. An N-terminal 106 is provided on the upper portion 100 of the N-busbar 96.

Figure 11:
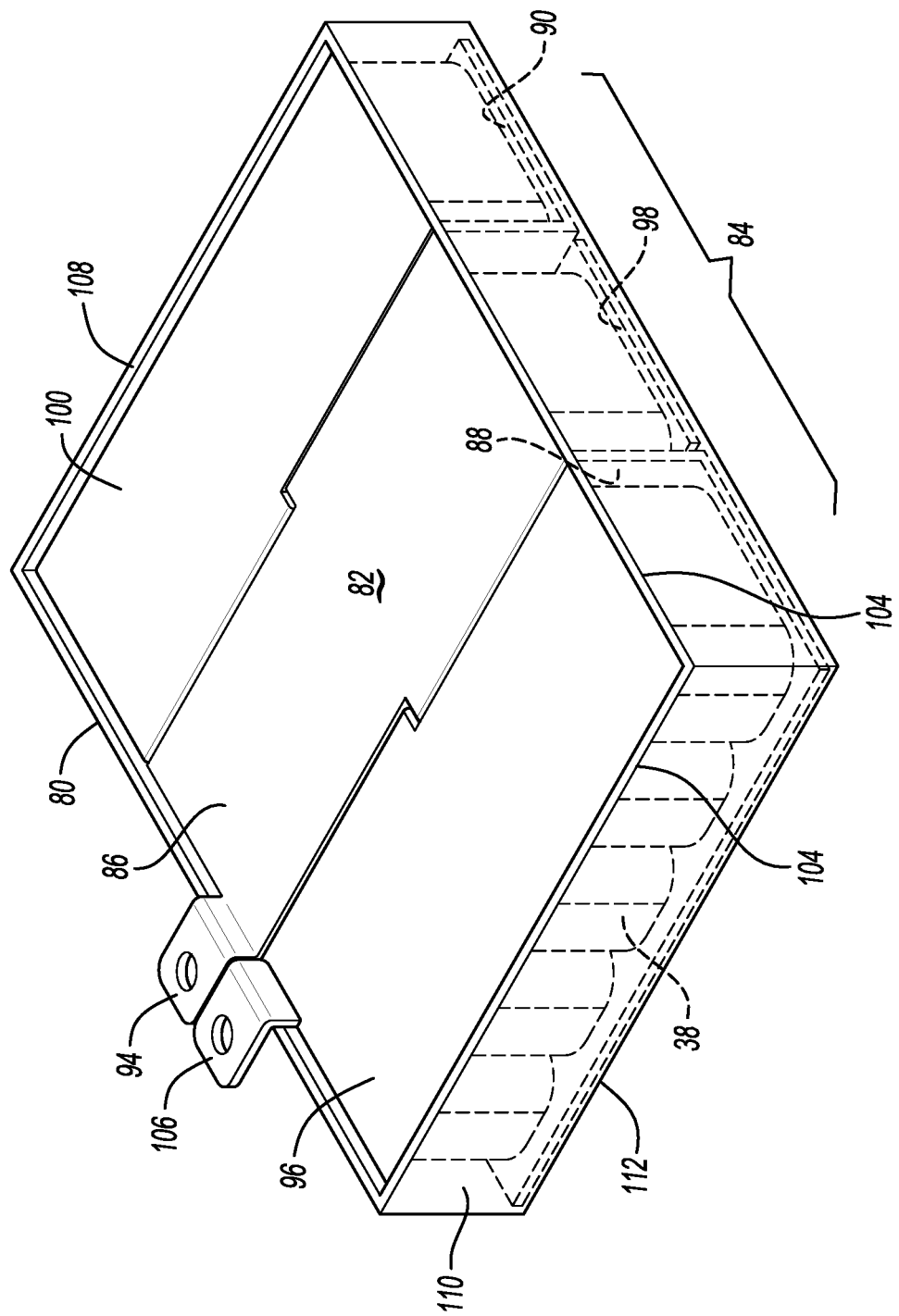
FIG. 11 is a diagrammatic perspective view of the P busbar and the N busbar disposed in the housing with capacitor cells arranged in linear arrays with alternating rows being oppositely oriented.

Referring to FIG. 11, the capacitor module 80 is shown with the P-busbar 82, the N-busbar 96 and three linear arrays of capacitor cells 38 installed in the housing 108 that is shown with some of the sidewalls 110 in phantom and the base wall 112 supporting the capacitor cells 38. The P-terminal 94 and N-terminal 106 extend outwardly from an upper area of the housing 108. While three linear arrays of capacitor cells 38 are shown in FIGS. 9-11, it should be understood that any number of linear arrays may be provided depending upon the desired number of capacitor cells 38.

The words used in the specification are words of description rather than limitation, and it is understood that various changes may be made without departing from the spirit and scope of the disclosure and claims. As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A capacitor module comprising:
a housing;
a plurality of capacitor cells aligned in a first cell array and a second cell array on a base plate of the housing, wherein the first and second cell arrays have a P-end of each cell and an N-end of each cell, and wherein the P-end and N-end of adjacent first and second cell arrays are inverted relative to each other;
a first busbar having a first lower portion directly contacting the P-end of each cell below the first cell array, a first upper portion directly contacting the P-end of each cell above the second cell array, and a first intermediate portion connecting the first lower portion and the first upper portion; and
a second busbar having a second lower portion directly contacting the N-end of each cell below the second cell array, a second upper portion directly contacting the N-end of each cell above the first cell array, and a second intermediate portion connecting the second lower portion and the second upper portion, wherein the first busbar and the second busbar are electrically isolated from each other.

2. The capacitor module of claim 1 further comprising:
a P-terminal connected to the first busbar
an N-terminal connected to the second busbar.

3. The capacitor module of claim 1 further comprising:
a heat sink; and
a thermal interface material disposed between the heat sink and the base plate.

4. The capacitor module of claim 3 wherein the base plate is copper.

5. The capacitor module of claim 1 further comprises:
a third lower portion of the first busbar directly contacting the P-end of each cell below a third cell array adjacent the second cell array, and a third intermediate portion connecting the third lower portion to the second upper portion; and
a third upper portion of the second busbar directly contacting the N-end of each cell above the third cell array, and a fourth intermediate portion connecting the second lower portion and the third upper portion.

6. The capacitor module of claim 1 wherein the first and second busbars provide a thermal path between the first and second cell arrays to the base plate.

7. The capacitor module of claim 1 further comprising:
a cold plate disposed below the first lower portion of the first busbar and the second lower portion of the second busbar, wherein a layer of thermal interface material is provided between the first and second lower portions and the cold plate.

8. A capacitor module comprising:
a housing including a base plate;
a plurality of capacitor cells aligned in several linear arrays on the base plate, wherein the linear arrays have a P-end of each cell and a N-end of each cell, and wherein the P-end of each cell and N-end of each cell of adjacent linear arrays are oppositely oriented relative to each other;
an N-busbar contacting an N-end of the capacitor cells of the several linear arrays; and
a P-busbar contacting a P-end of the capacitor cells of the several linear arrays, wherein the N-busbar includes N-busbar linking portions connecting the N-ends of adjacent linear arrays, and the P-busbar includes P-busbar linking portions connecting the P-ends of adjacent linear arrays, and wherein the N-busbar and the P-busbar are electrically isolated from each other.

9. The capacitor module of claim 8 further comprising:
a P-terminal connected to the P-busbar; and
an N-terminal connected to the N-busbar.

10. The capacitor module of claim 8 wherein the P-busbar includes lower P contact surfaces directly contacting the P-end of each cell in odd numbered linear arrays and includes upper P contact surfaces directly contacting the P-end of each cell in even numbered linear arrays, and the N-busbar includes lower N contact surfaces directly contacting the N-end of each cell in odd numbered linear arrays and includes upper N contact surfaces directly contacting the N-end of each cell in even numbered linear arrays.

11. The capacitor module of claim 8 further comprising:
a P-terminal connected to the P-busbar
an N-terminal connected to the N-busbar.

12. The capacitor module of claim 8 further comprising:
a cold plate; and a thermal interface material disposed between the cold plate and the base plate.

13. The capacitor module of claim 8 in combination with a power module, further comprising:
   a cold plate having a first side and a second side opposite the first side, the first side being assembled to the power module;
   a capacitor module assembled to a second side of the cold plate; and
   a fluid circulation system operatively connected to the cold plate to circulate a fluid through the cold plate.

14. The capacitor module and power module of claim 8, further comprising:
   an intermediate cold plate disposed between the capacitor module and power module, the intermediate cold plate having a fluid circulation system including an inlet cooling channel and an outlet cooling channel that extend through the power module and are connected to an internal coolant flow channel defined by the intermediate cold plate.

15. The capacitor module and power module of claim 14 further comprising:
   a base cold plate; and
      a thermal interface material disposed between the base cold plate and the base plate.

* * * * *